US009525544B2

(12) United States Patent
Green et al.

(10) Patent No.: US 9,525,544 B2
(45) Date of Patent: Dec. 20, 2016

(54) REFERENCELESS CLOCK RECOVERY CIRCUIT WITH WIDE FREQUENCY ACQUISITION RANGE

(71) Applicant: THE REGENTS OF THE UNIVERSITY OF CALIFORNIA, Oakland, CA (US)

(72) Inventors: Michael M. Green, Irvine, CA (US); Sui Huang, Corona, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 26 days.

(21) Appl. No.: 14/716,593

(22) Filed: May 19, 2015

(65) Prior Publication Data
US 2015/0349945 A1   Dec. 3, 2015

Related U.S. Application Data

(60) Provisional application No. 62/000,176, filed on May 19, 2014.

(51) Int. Cl.
H03D 3/24          (2006.01)
H04L 7/033         (2006.01)
H04B 1/00          (2006.01)
H04L 7/00          (2006.01)
H04L 25/00         (2006.01)
H03L 7/089         (2006.01)

(52) U.S. Cl.
CPC ............ H04L 7/033 (2013.01); H03L 7/0891 (2013.01); H04B 1/0082 (2013.01); H04L 7/0004 (2013.01); H04L 7/0087 (2013.01); H04L 25/00 (2013.01); H03J 2200/10 (2013.01)

(58) Field of Classification Search
CPC .... H04B 15/02; H04B 2215/067; H04L 7/033
USPC ......................................................... 375/376
See application file for complete search history.

(56) References Cited

U.S. PATENT DOCUMENTS

| 8,155,165 B2* | 4/2012 | Agoston ................ H04B 15/02 375/130 |
| 2005/0258883 A1* | 11/2005 | Farjad-rad ................ G06F 1/04 327/295 |
| 2010/0073045 A1* | 3/2010 | Chen ..................... H03L 7/0807 327/156 |
| (Continued) | | |
| 2011/0273215 A1* | 11/2011 | Gupta .................. H03L 7/0807 327/298 |

OTHER PUBLICATIONS

Anond, S.B., et al., "A 2.75Gb/s CMOS Clock Recovery Circuit with Broad Capture Range", 2001, ISSCC Dig. Tech. Papers, pp. 214-215.

(Continued)

Primary Examiner — David S Huang
(74) Attorney, Agent, or Firm — One LLP

(57) ABSTRACT

A full-rate referenceless clock-data recovery architecture with neither a frequency detector nor a lock detector that allows both frequency and phase locking in a single loop. According to one embodiment, a referenceless clock data recovery (CDR) circuit, comprises a digital control circuit (DCC), a phase and strobe point detector circuit (PSPD), and an LC voltage control oscillator (LC VCO) electrically coupled to the PSPD and DCC such that a frequency of the LC VCO decreases when a negative strobe point is detected and an initial frequency of the LC VCO is higher than an input data bit rate.

13 Claims, 9 Drawing Sheets

OTHER PUBLICATIONS

Cao, J., et al., "Non-Idealities in Linear CDR Phase Detectors", 2011, 20th European Conference on Circuit Theory and Design (ECCTD), pp. 158-161.

Kocaman, N., et al., "An 8.5-1 1.5-Gbps SONET Transceiver With Referenceless Frequency Acquisition", 2013, IEEE Journal of Solid-State Circuits, vol. 48, No. 8, pp. 1-10.

Lee, J., et al., "A 20-Gb/s Full-Rate Linear Clock and Data Recovery Circuit With Automatic Frequency Acquisition", 2009, IEEE Journal of Solid-State Circuits, vol. 44, No. 12, pp. 3590-3602.

Pottbäcker, A., et al., "A Si Bipolar Phase and Frequency Detector IC for Clock Extraction up to 8 Gb/s", 1992, IEEE Journal of Solid-State Circuits, vol. 27, No. 12, pp. 1747-1751.

Huang, S, et al., "An 8.2 Gb/s-to-10.3 Gb/s Full-Rate Linear Referenceless CDR Without Frequency Detector in 0.18 μm CMOS", IEEE Journal of Solid-State Circuits, 2015, vol. 50, No. 9, pp. 2048-2060.

\* cited by examiner

With PAM

Without PAM

REFERENCELESS CLOCK RECOVERY CIRCUIT WITH WIDE FREQUENCY ACQUISITION RANGE

The present application claims priority to U.S. Provisional Application No. 62/000,176 titled "REFERENCELESS CLOCK RECOVERY CIRCUIT WITH WIDE FREQUENCY ACQUISITION RANGE" and filed on May 19, 2014, the entirety of which is incorporated herein by reference.

FIELD

The embodiments described herein relate generally to communication electronics and, more particularly, to a circuit that recovers a full-rate clock signal from a random digital data signal that has a very wide acquisition range.

BACKGROUND INFORMATION

As an alternative to the conventional dual-loop architecture, referenceless clock data recovery (CDR) architectures have become more popular in industry because of their simplicity and flexibility. However, the robustness of the transition between frequency acquisition and phase locking is always a concern, particularly for the linear CDR, which has an extremely limited capture range.

Many works, based mainly on the Pottbacker frequency detector (FD) [1], have been reported. In Lee [2] the capture range of the FD was only ±2.4% at 20 Gb/s with no capacitor bank in the voltage control oscillator (VCO); in Anond [3] the capture range of the FD was about ±6.4% at 2.75 Gb/s, with an 8-bit resolution of the capacitor bank in the VCO; in Kocaman [4] the capture range was ±15% at 10 Gb/s, with an 11-bit resolution of the capacitor bank. Thus the Pottbacker FD inherently suffers from a limited capture range, requiring a dedicated FD and a stringent tradeoff between the CDR capture range and the number of VCO bands. In the presence of input jitter and phase detector nonidealities, it is difficult to design an architecture where the resolution of the capacitor bank and the turnoff mechanism can guarantee that the VCO frequency will eventually fall within the pull-in range of the CDR.

In view of the foregoing, it is therefore desirable to provide a circuit that recovers a full-rate clock signal from a random digital data signal that has a very wide acquisition range.

SUMMARY

The present disclosure is directed to a full-rate referenceless clock-data recovery (CDR) architecture with neither a frequency detector nor a lock detector that allows both frequency and phase locking in a single loop. According to certain embodiments, a referenceless CDR circuit comprises a digital control circuit (DCC), a combined phase and strobe point detector circuit (PSPD), and an LC voltage control oscillator (LC VCO) electrically coupled to the PSPD and DCC such that a frequency of the LC VCO decreases when a negative strobe point is detected and an initial frequency of the LC VCO is higher than an input data bit rate.

Other systems, methods, features and advantages of the example embodiments will be or will become apparent to one with skill in the art upon examination of the following figures and detailed description.

BRIEF DESCRIPTION OF THE FIGURES

The details of the example embodiments, including structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Each of the additional features and teachings disclosed below can be utilized separately or in conjunction with other features and teachings to produce a circuit that recovers a full-rate clock signal from a random digital data signal that has a very wide acquisition range. Representative examples of the present invention, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detailed description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

Conventional clock-data recovery circuits typically implement two loops: a first loop, which has a large frequency acquisition range, locks to the correct frequency; and a second loop, which has a small frequency acquisition range, achieves phase locking Having two loops requires more circuitry and dissipates more power than that of a single-loop implementation. The embodiments described herein provide a novel technique that allows both frequency and phase locking in a single loop with a much higher frequency acquisition range than in the prior art.

The embodiments described herein are directed to a full-rate referenceless CDR architecture with neither an FD nor a lock detector. The operation of the architecture is instead based on the theory that if an offset (or "strobe point") is deliberately introduced into the PD characteristic, the pull-in range will be enhanced as long as the initial frequency offset is the appropriate polarity [5].

Figure 1:
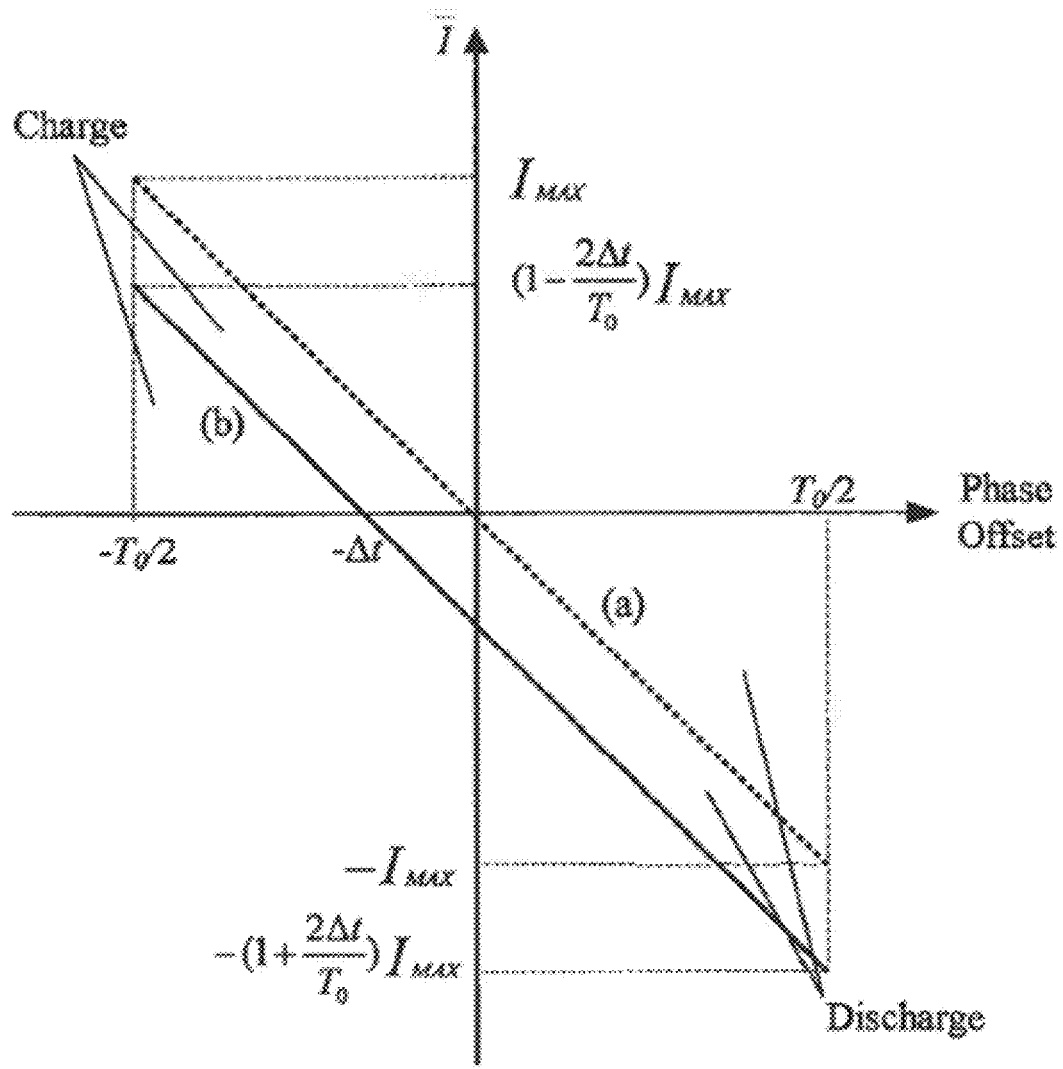
FIG. 1 illustrates conventional phase detector transfer curves when a strobe point is (a) 0, (b) -Δt.

FIG. 1 illustrates conventional phase detector transfer curves. In FIG. 1, if the strobe point (SP) is negative as illustrated in curve (b) 101 and the initial VCO frequency is higher than the input data bit rate, then the VCO frequency will naturally decrease toward the correct frequency since there will be a net discharge of the loop filter during each cycle slip compared with the ideal case as shown in curve (a) 100. Therefore, the linear PD itself can function as an FD with a very high capture range if the polarity of the SP is set appropriately, consistent with the initial VCO frequency.

Figure 2:
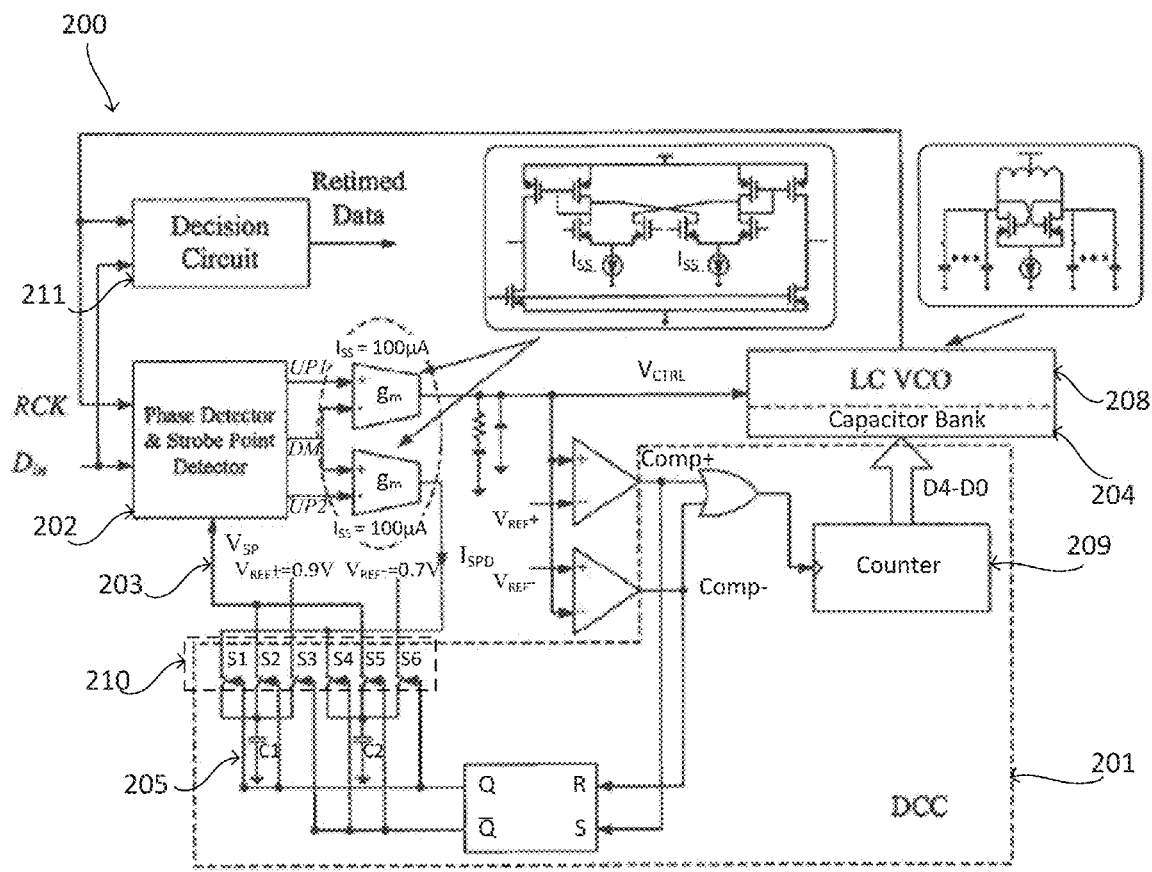
FIG. 2 illustrates a block diagram of the proposed referenceless CDR architecture with strobe point control and phase adjustment circuit, according to certain embodiments.
Figure 4:
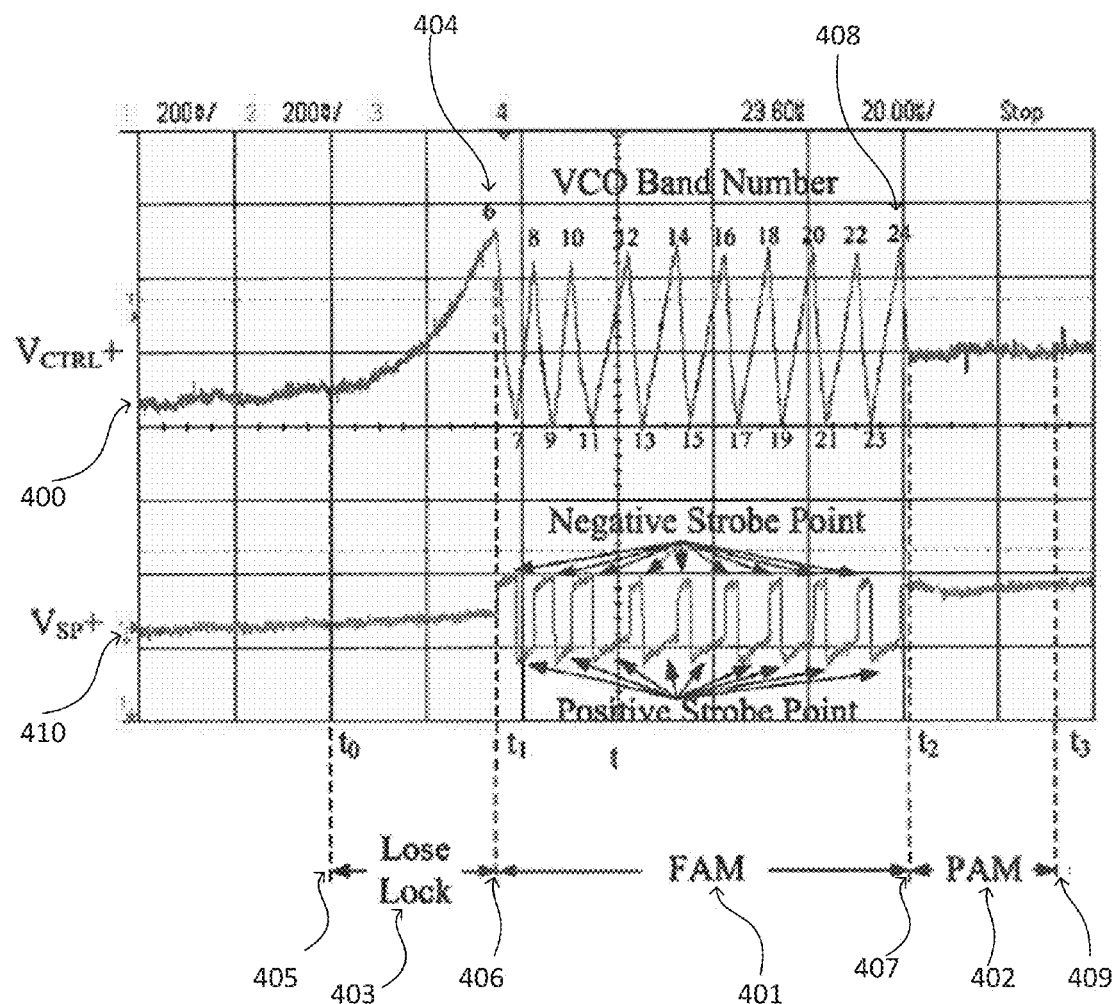
FIG. 4 illustrates measured waveforms of $V_{CTRL}+$ and $V_{SP}+$, according to certain embodiments.

FIG. 2 illustrates a block diagram of an example embodiment of the architecture for a referenceless CDR circuit 200 having strobe point control and phase adjustment circuit, according to one embodiment. The referenceless CDR circuit 200 comprises a digital control circuit (DCC) 201 201 and a combined phase detector and strobe point detector circuit (PSPD) 202. A decision circuit 211 provides retimed data output. The SP of the PSPD 202 is controlled by voltage $V_{SP}$ 203, which is generated by the DCC 201. A frequency acquisition algorithm is used to set the polarity of the SP and search the correct band in the capacitor bank 204 while in the frequency acquisition mode (FAM) 401 (FIG. 4). The resolution of the capacitor bank 204 is 5 bits, since the "single-sided" pull-in range is sufficiently wide and the requirement for the tuning range in each band does not need to be very stringent. All signals are differential other than those in the digital control circuit (DCC) 201.

Figure 3:
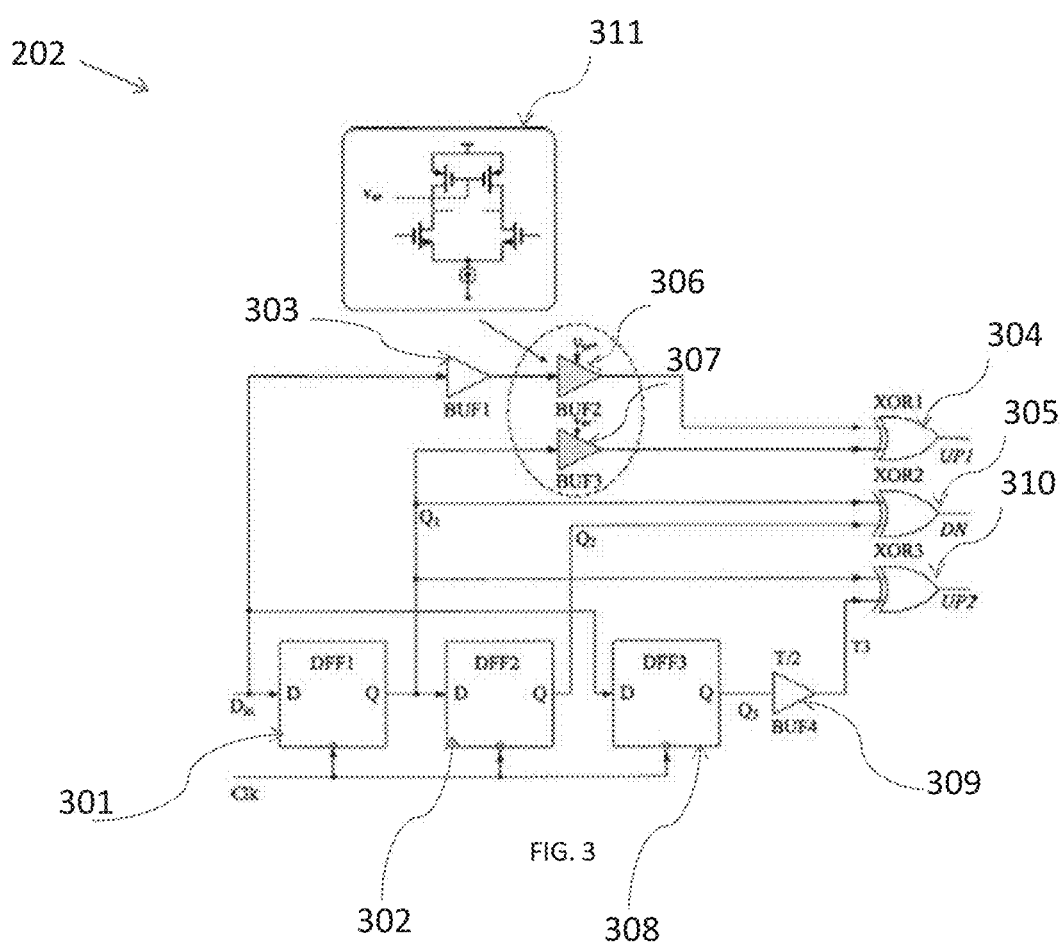
FIG. 3 illustrates a combined phase detector/strobe point detector (PSPD) circuit, according to certain embodiments.

FIG. 3 illustrates an example embodiment of the PSPD circuit 202 shown in FIG. 2. The PSPD circuit 202 includes a standard Hogge PD comprised of DFF1 301, DFF2 302, BUF1 303, XOR1 304, and XOR2 305. Two tunable buffers BUF2 306 and BUF3 307 enable adjustment of the value of the SP. The adjustment is achieved by changing the difference between the delays of BUF2 306 and BUF3 307 via V+ and $V_{SP}$−. According to one embodiment, the value of the SP can be adjusted overall by a range of ±15 ps. The tunable buffers BUF2 306 and BUF3 307 are realized by current-mode logic (CML) as shown in 311, using triode-biased PMOS transistors in place of resistors. By changing $V_{SP}$+ and $V_{SP}$−, the output RC time constants and thus the delay times of the buffer cells vary. Once the frequency acquisition has completed, the clock signal is then nearly frequency-locked to the data, but with a strobe point that might be far from zero. Thus it is necessary to have a phase adjustment mode (PAM) 402 (FIG. 4) after locking The PSPD circuit 202, which includes DFF1 301, DFF2 301, DFF3 308, BUF4 309, XOR2 305, and XOR3 310, has a bang-bang characteristic with a nearly zero strobe point and is much less sensitive to delay mismatches than the linear PD. The average value of (UP2−DN) provides a voltage that has the same sign as the SP. As shown in FIG. 2, this voltage is converted to a current $I_{SPD}$ 207 and then integrated onto either C1 205 or C2 206 to feed back to the PSPD 202 in order to bring the SP close to zero in the PAM 402.

The frequency acquisition mode (FAM) 401 functions as follows. If $V_{CTRL}>V_{REF}+$ (corresponding to the VCO 208 frequency being higher than the bit rate in the band), then Comp+ is high and the counter 209 is incremented while at the same time switches S1, S2, and S6 of switch bank 210 are closed. Since C1 205 has been precharged, this sets $V_{SP}$ to $V_{EXT}+$, which sets the PD 202 strobe point to approximately −15 ps, and the PD 202 pulls the VCO 208 in the correct direction. (The opposite response occurs if $V_{CTRL}<V_{REF}-$, with switches S3, S4, and S5 of switch bank 210 closed). If the VCO 208 has been set to the correct band, the CDR will lock; otherwise $V_{CTRL}$ will continue decreasing until it goes below $V_{REF}-$, at which time the counter is incremented again, changing the VCO 208 to a new, lower frequency band, while the SP is set to be positive to pull up the VCO 208 frequency. This process continues until the appropriate band has been reached, the frequency settles to the correct value with $V_{CTRL}$ close to its final value, and a large SP is no longer needed. At this time the PAM 402 takes over, and $V_{SP}$ adjusts itself to set the strobe point of the PSPD 202 to be very close to zero.

FIG. 4 illustrates measured waveforms of $V_{CTRL}+$ 400 and $V_{SP}+$ 410, according to certain embodiments. FIG. 4 also illustrates FAM 401 and PAM 402 processes. Initially the CDR is locked at 9.7 Gbps, which corresponds to band 6 404 (where band 1 is the highest and band 32 is the lowest frequency band of the VCO). At $t_0$ 405, the input bit rate is switched to 8.4 Gbps, and the loop starts to lose lock 403. At $t_1$ 406, the FAM 401 is activated. The correct band (band 24 408) is found at $t_2$ 407, and then the PAM 402 takes over. The system is phase locked at $t_3$ 409.

According to certain embodiments, the chip of the present disclosure is fabricated in the Jazz Semiconductor SBC 18 BiCMOS technology using only 0.18 μm CMOS transistors and is tested with a 1.8-V supply. The chip consumes 174 mW at 10.3 Gbps, not including the output buffer. The CDR capture range is from 8.2 to 10.3 Gbps covering the entire VCO range.

Figure 5:
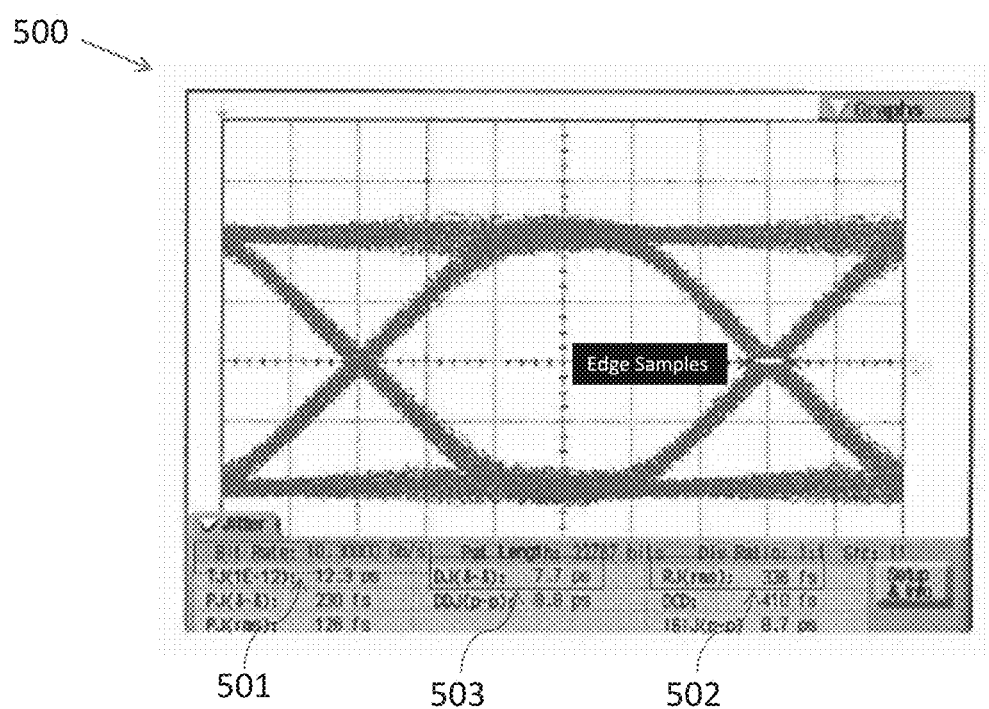
FIG. 5 illustrates an eye diagram of recovered data, according to certain embodiments.

FIG. 5 illustrates an eye diagram 500 of recovered data, according to certain embodiments. The eye diagram 500 illustrates a response by a test chip according to the embodiment described herein to a $2^{31}-1$ pseudo random binary sequence (PRBS). The measured random jitter 502 and pattern-dependent deterministic jitter 503 at a bit rate 501 of 10.3 Gbps were 0.336 $ps_{rms}$ and 7.7 $ps_{pp}$, respectively.

Figures 6A, 6B:
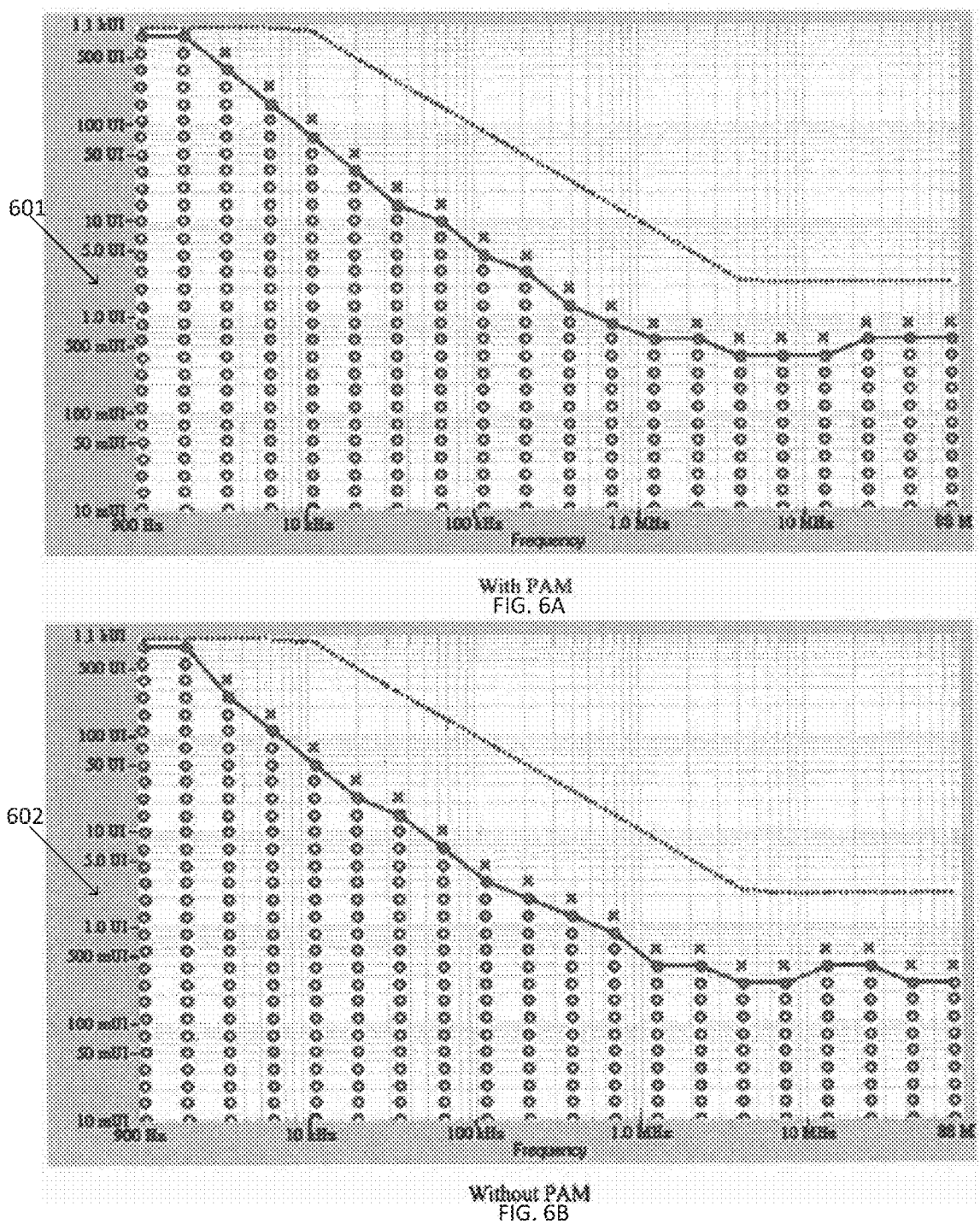
FIG. 6A illustrates a jitter tolerance comparison for operation with PAM, according to certain embodiments.
FIG. 6B illustrates a jitter tolerance comparison for operation without PAM, according to certain embodiments.

FIG. 6A illustrates a jitter tolerance comparison 601 for operation with PAM, according to certain embodiments. FIG. 6B illustrates a jitter tolerance comparison 602 for operation without PAM, according to certain embodiments. In the case of operation without PAM 602, the differential-mode component of $V_{SP}$ was set to 0. Setting a BER of $10^{-12}$, the out-of-band jitter tolerance is 0.58 UI with the SPD activated, improved from 0.25 UI with the SPD deactivated.

Figure 7:
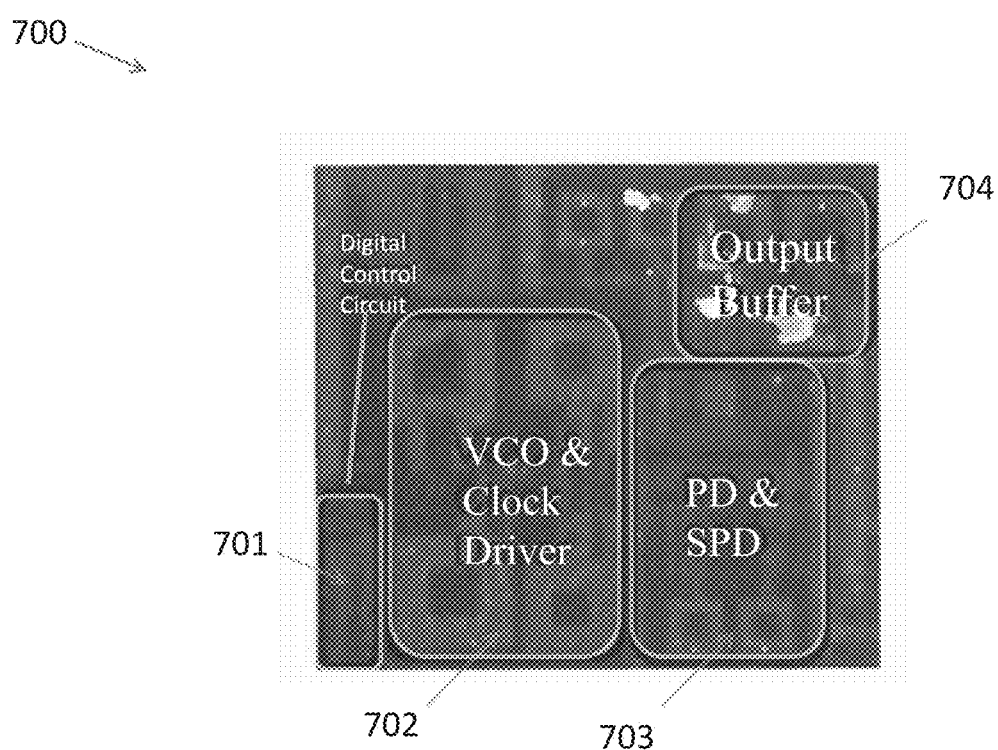
FIG. 7 illustrates a die photo of a referenceless CDR architecture with strobe point control and phase adjustment circuit, according to certain embodiments.

FIG. 7 illustrates a die photo 700 of a referenceless CDR architecture with strobe point control and phase adjustment circuit, according to certain embodiments. The die photo 700 illustrates the layout of the digital control circuit 701, the VCO and clock driver circuit 702, the PD and SPD circuit 703, and the output buffer 704. According to certain embodiments, the active area of the chip is 0.9×0.6 mm².

The test chip illustrated by die photo 700 used a 0.18-µm CMOS fabrication process.

Figure 8:
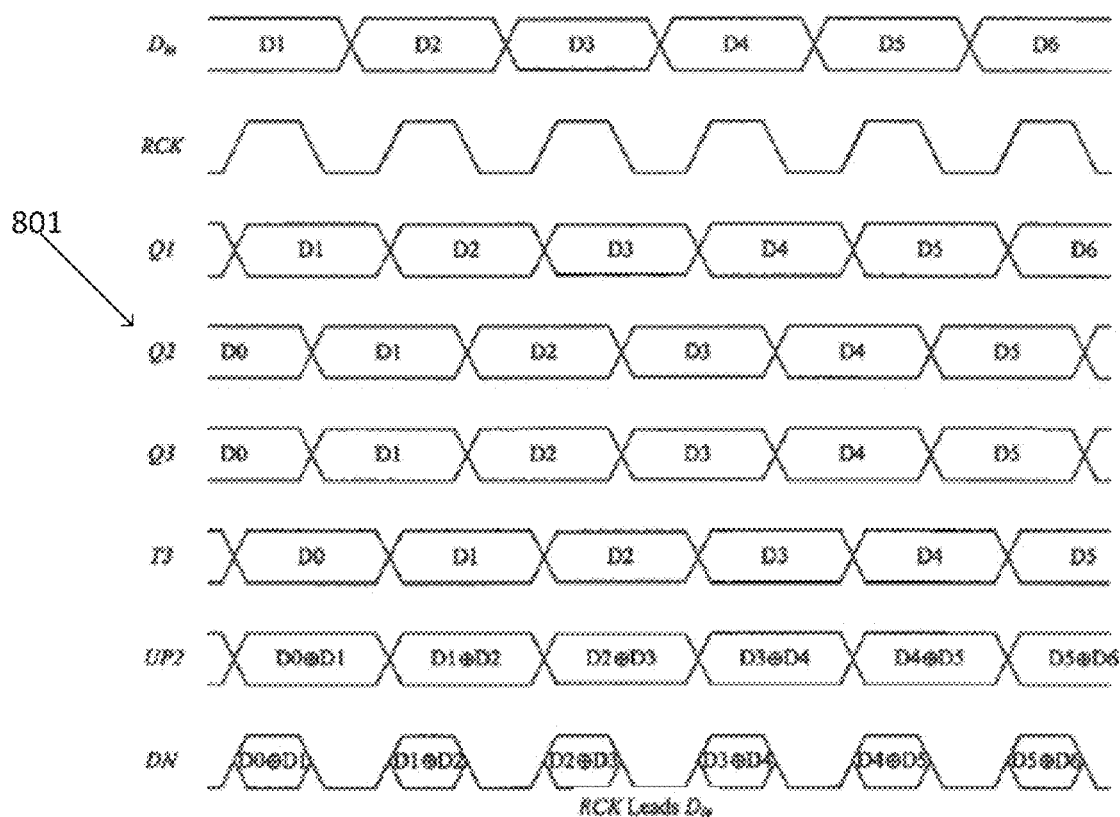
FIG. 8 illustrates a timing diagram of an SPD circuit of the present disclosure, according to certain embodiments.
Figure 8:
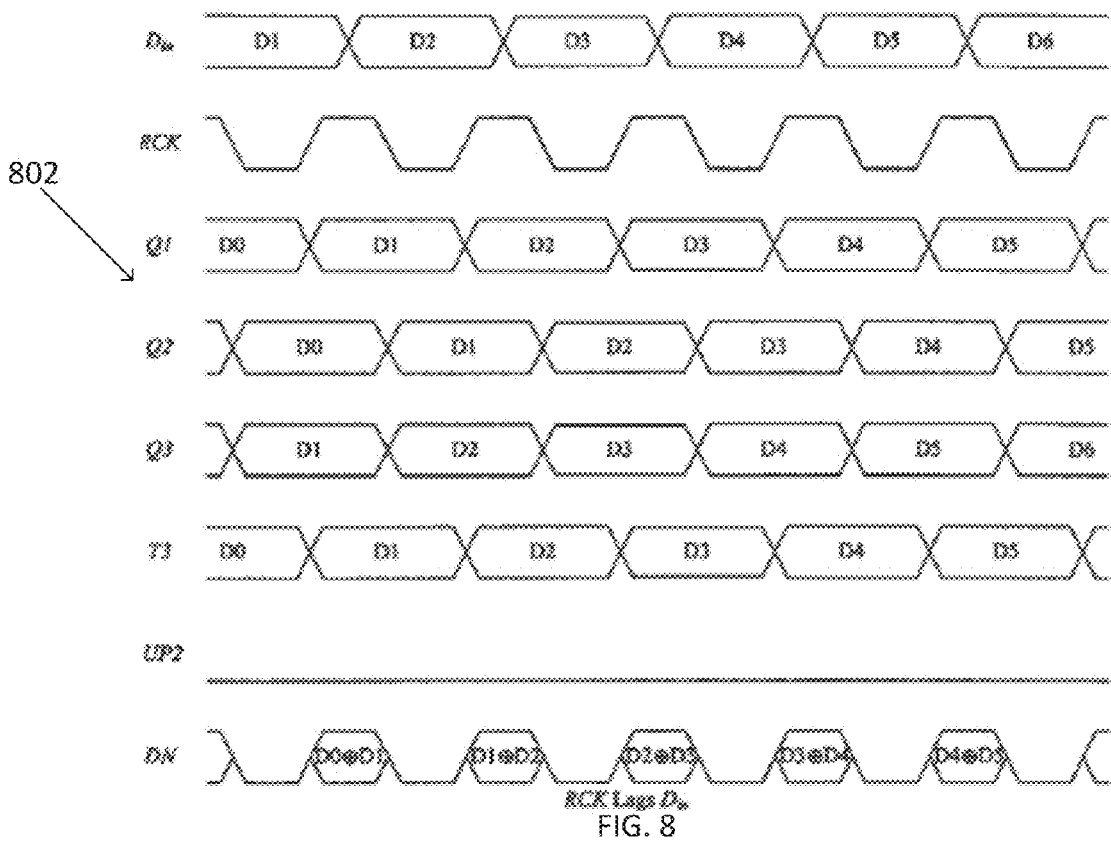

FIG. 8 illustrates a timing diagram of an SPD circuit of the present disclosure, according to certain embodiments. FIG. 8 illustrates the cases when RCK leads $D_m$ 801 and when RCK lags $D_m$ 802.

The measured results illustrated in FIGS. 5-8 show that with the phase adjustment, the proposed architecture has a much better jitter tolerance than simply using the initial strobe point of the linear PD. The example embodiments provided herein, however, are merely intended as illustrative examples and not to be limiting in any way.

Figure 9:
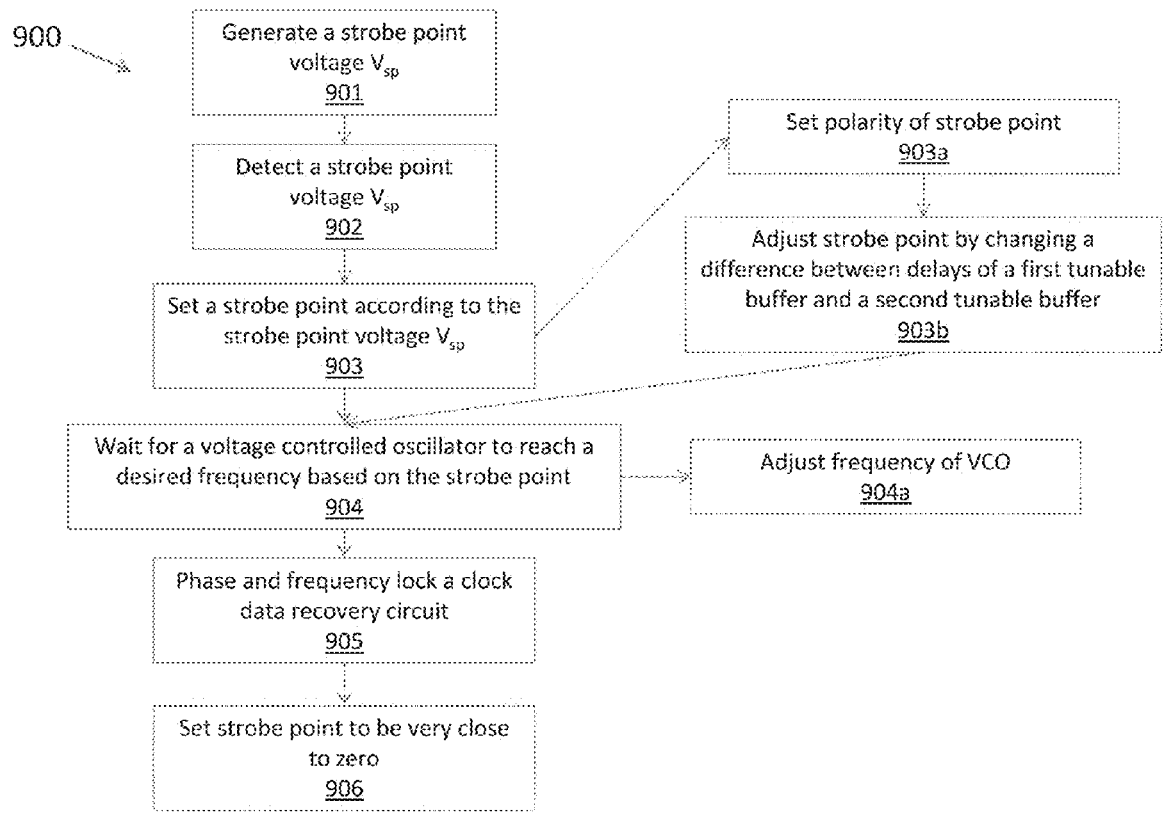
FIG. 9 illustrates a frequency locking process, according to certain embodiments.

FIG. 9 illustrates a frequency locking process 900, according to certain embodiments. A process 900 of frequency locking a clock data recovery (CDR) circuit includes generating a strobe point voltage $V_{SP}$ 901 by a digital control circuit (DCC). The strobe point voltage ($V_{SP}$) is detected 902 by a phase and strobe point detector circuit (PSPD). A strobe point (SP) is set 903 according to the strobe point voltage ($V_{sp}$). The method includes waiting 904 for a voltage control oscillator (VCO) to reach a desired frequency based on the SP, and phase and frequency locking 905 the CDR circuit.

The process 900 can further include using a frequency acquisition algorithm to set a polarity 903a of the strobe point (SP) and adjusting 903b the strobe point (SP) by changing a difference between delays of a first tunable buffer and a second tunable buffer.

The process 900 can further include adjusting 904a the VCO frequency by the PSPD. The strobe point (SP) can also be set 906 to be very close to zero once the CDR circuit is locked 905.

The process 900 can further include using the frequency acquisition algorithm to search a correct band in a capacitor bank while in the CDR is in frequency acquisition mode (FAM) (not shown). The process 900 can further include converting a voltage output from the PSPD to a current $I_{SPD}$ and integrating the current $I_{SPD}$ onto a capacitor of the DCC to bring the SP close to zero in a phase adjustment mode (PAM) (not shown).

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, unless otherwise stated, and the invention can be performed using different or additional process actions, or a different combination or ordering of process actions. As another example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

REFERENCES

[1] A. Pottbacker, et al., "A Si Bipolar Phase and Frequency Detector IC for Clock Extraction up to 8 Gb/s,"*IEEE I Solid-State Circuits*, vol. 27, pp. 1747-1751, December 1992.

[2] J. Lee and K. C. Wu, "A 20 G/s Full-Rate Linear Clock and Data Recovery Circuit With Automatic Frequency Acquisition," *IEEE.1. Solid-State Circuits*, vol. 44, pp. 3 590-3602, December 2009.

[3] S. B. Anond, and B. Razavi, "A 2.75 Gb/s CMOS Clock Recovery Circuit With Broadband Capture Range," *ISSCC Dig. Tech. Papers*, pp. 214-215, February 2001.

[4] N. Kocaman et al., "An 8.5-1 1.5-Gbps SONET Transceiver With Referenceless Frequency Acquisition," *IEEE I Solid-State Circuits*, vol. 48, pp. 1875-1884, August 2013.

[5] J. Cao, S. Huang, M. M. Green, "Non-Idealities in Linear CDR Phase Detectors," *European Conf on Circuit Theory and Design*, 158-161, August 2011

What is claimed is:

1. A referenceless clock data recovery (CDR) circuit, comprising:
    a digital control circuit (DCC) configured to generate a strobe point voltage (Vsp);
    a phase and strobe point detector circuit (PSPD) electrically coupled to the DCC and configured to detect the strobe point voltage (Vsp) generated by the DCC and set a strobe point (SP) according to the strobe point voltage ($V_{sp}$); and
    an LC voltage control oscillator (LC VCO) electrically coupled to the PSPD and DCC, wherein the LC VCO is configured to detect the strobe point (SP) set by the PSPD and to decrease a frequency of the LC VCO when the strobe point (SP) is negative and an initial frequency of the LC VCO is higher than an input data bit rate.

2. The CDR circuit of claim 1, wherein the PSPD comprises a Hogge phase detector (PD).

3. The CDR of claim 2, wherein the PSPD further comprises a tunable buffer.

4. The CDR of claim 3, wherein the tunable buffer comprises triode-based PMOS transistors.

5. The CDR of claim 1, further comprising a capacitor bank.

6. The CDR of claim 5, wherein the capacitor bank has a resolution of 5 bits.

7. A method of frequency locking a clock data recovery (CDR) circuit, comprising:
    generating a strobe point voltage (Vsp) by a digital control circuit (DCC);
    detecting the strobe point voltage (Vsp) by a phase and strobe point detector circuit (PSPD) and setting a strobe point (SP) according to the strobe point voltage (Vs$_{sp}$); and
    phase and frequency locking the CDR circuit once a voltage control oscillator (VCO) has reached a desired frequency based on the polarity of the SP and an input data bit rate.

8. The method of claim 7, further comprising adjusting the SP by changing a difference between delays of a first tunable buffer and a second tunable buffer.

9. The method of claim 7, wherein frequency locking comprises adjusting, by the PSPD, the VCO frequency.

10. The method of claim 7, further comprising setting the SP to be very close to zero once the CDR circuit is locked.

11. The method of claim 7, further comprising using a frequency acquisition algorithm to set the polarity of the SP.

12. The method of claim 11, further comprising using the frequency acquisition algorithm to search a correct band in a capacitor bank while in the CDR is in frequency acquisition mode (FAM).

13. The method of claim 7, further comprising converting a voltage output from the PSPD to a current $I_{SPD}$; and integrating the current $I_{SPD}$ onto a capacitor of the DCC to bring the SP close to zero in a phase adjustment mode (PAM).

\* \* \* \* \*